United States Patent [19]

Scott, III

[11] Patent Number: 5,140,279

[45] Date of Patent: Aug. 18, 1992

[54] SLEW RATE ENHANCED LINEAR AMPLIFIER

[75] Inventor: Baker P. L. Scott, III, Austin, Tex.

[73] Assignee: Crystal Semiconductor Corporation, Austin, Tex.

[21] Appl. No.: 621,471

[22] Filed: Dec. 3, 1990

[51] Int. Cl.$^5$ ............................................. H03F 1/34
[52] U.S. Cl. .................................. 330/156; 330/260; 330/294
[58] Field of Search ................... 330/84, 85, 126, 151, 330/156, 260, 294, 295

[56] References Cited

U.S. PATENT DOCUMENTS

| | | | |
|---|---|---|---|
| 4,405,900 | 9/1983 | van de Plassche | 330/151 |
| 4,739,281 | 4/1988 | Doyle | 330/260 X |

OTHER PUBLICATIONS

Data Sheet for the OP-05 Instrumentation Operational Amplifier, *PMI Data Book Precision Analog Integrated Circuits*, pp. 5-46 through 5-54, 1988.
Data Sheet for the OP-01 Inverting High-Speed Operational Amplifier, *PMI Data Book Precision Analog Integrated Circuits*, pp. 5-24 through 5-29, 1988.
Data Sheet for the LM118/LM218/LM318 Operational Amplifiers. *Linear Data Book National Semiconductor Corporation*, pp. 3-165 through 3-171, 1982.
Erdi, George, et al., "A Precision FET-Less Sample-and-Hold with High Charge-to-Droop Current Ratio," IEEE Journal of Solid-State Circuits, vol. SC-13, No. 6, Dec. 1978, pp. 864-873.
Precision Monolithics, Inc., Data Sheet for the OP-05 Instrumentation Operational Amplifier, Jun. 1987.
Precision Monolithics, Inc., Data Sheet for the OP-01 Inverting High-Speed Operational Amplifier, Jun. 1987.
National Semiconductor Data Sheet for the LM118/LM218/LM318 Operational Amplifiers. 1982 National Semiconductor Data Book.

*Primary Examiner*—James B. Mullins
*Attorney, Agent, or Firm*—Leonard & Lott

[57] ABSTRACT

A high speed feedback amplifier is frequency compensated utilizing circuitry that does not cause distortion in the amplifier nor does it limit the slew rate of the amplifier. In one embodiment compensation circuitry drives one side of the compensation capacitor forcing the signal voltage across the compensation capacitor to zero while still providing bandwidth compensation. Since no current gets driven into the capacitor, no distortion or slew limitations are created by the compensation. In a second embodiment the voltage across the compensation capacitor is allowed to change, however the signal current for the compensation capacitor is supplied by a linear charging circuit which removes this charging requirement from the amplifier. Therefore, as in the first embodiment, no distortion or slew limitation is created by the addition of the frequency compensation.

16 Claims, 3 Drawing Sheets

SLEW RATE ENHANCED LINEAR AMPLIFIER

REFERENCE TO RELATED APPLICATION

Reference is made to a related application entitled COMPENSATION FOR A FEEDBACK AMPLIFIER WITH CURRENT OUTPUT STAGE, Ser. No. 071,621,475, filed Dec. 3, 1990 in the name of Scott, Baker P., III, and which is hereby incorporated by reference. This application describes and claims bandwidth compensation techniques for amplifiers with current output stages, one of which is used in the preferred embodiment of the present invention.

TECHNICAL FIELD

The present invention pertains to high speed amplifiers, and more particularly, to linear, slew rate enhanced, high speed amplifiers.

BACKGROUND OF THE INVENTION

There are many applications for high speed feedback amplifiers which are not slew rate limited. One such application is a transconductance amplifier used in an Ethernet interface chip for tapping into a coaxial cable in an Ethernet system. The interface chip receives a digital signal and converts it to a current in the coax cable. Because of the Ethernet electrical specifications relating to rise time and fall time, frequency components in excess of 10 MHz must be amplified and converted with low distortion to an output current having a range of 0 to 90 milliamps.

Many transconductance amplifiers, while able to pass high frequencies, have stability compromises due to the changes in transconductance, gm, or gain in the output or feedback transistors as a function of the current levels through these transistors. Since the typical Ethernet interface requires variations in output currents of approximately 16 to 1, which results in approximately a four to one change in transconductance in a MOS transistor or a 16 to 1 change in a bipolar transistor, robust compensation techniques are required to provide stability in the interface circuit. However such compensation techniques can impose slew rate limits and cause distortion in the amplified signal. While techniques have been used in the past in amplifiers to detect that an amplifier is in a slew condition and to enable auxiliary circuitry to enhance the slew rate of the amplifier, such enhancement generally do not eliminate the nonlinearities in the output signal of the amplifier.

Therefore, it can be appreciated that compensation circuitry for high speed amplifiers which does not add distortion to the amplifier and which prevents slew rate degradation by the compensation circuitry is highly desirable.

SUMMARY OF THE INVENTION

It is, therefore, an object of this invention to provide compensation circuitry for an amplifier which effectively does not add distortion to the amplifier.

It is also an object of this invention to provide compensation circuitry which does not degrade the slew characteristics of an amplifier.

Shown in an illustrated embodiment of the invention is an amplifier having an input terminal for receiving an input signal. The amplifier also has an internal compensation node which is driven by an active circuit. The node is loaded by a compensation admittance, also referred to herein as a compensation capacitance, wherein a first terminal of the compensation capacitor is coupled to the node. The amplifier has a compensation driving amplifier for controlling the voltage at the second terminal of the compensation capacitor, the compensation driving circuit having an input terminal coupled to the input signal to the amplifier in order to minimize the charging current required by the compensation capacitor.

Also shown in an illustrated embodiment of the invention is a feedback amplifier in which the bandwidth is determined by device parameters in the amplifier which may vary during operation of the amplifier. The amplifier includes a compensation driving circuit for driving a compensation admittance also referred to as a compensation capacitor coupled to a first node in the amplifier. The first node is such that the capacitance at the node affects the bandwidth and stability of the amplifier. The compensation circuit includes a differencing amplifier having an output coupled to one end of the compensating capacitor, the other end of the compensating capacitor being coupled to the first node. The first input of the differencing amplifier is coupled to an input signal to the amplifier, and the second input of the differencing amplifier is coupled to a second node in the amplifier in a manner to minimize the voltage change and thus the charging current requirement of the compensation capacitor. The second node in the amplifier has signal characteristics which vary in an amount approximately proportional to the device parameters that affect the stability of the amplifier.

Yet another method of reducing the compensation signal current required from the amplifier's active circuitry is shown in an illustrated embodiment of the invention. A current injection circuit is used in an amplifier having a feedback loop in which the signal levels in the feedback loop are responsive to an input signal to the amplifier. A node in the feedback loop is driven by an active circuit and the node is also loaded by a capacitive element. The current injection circuit is coupled to the input signal and to the node for injecting or sinking current from the node in response to changes in the input signal to help the active circuit charge or discharge the capacitive element.

BRIEF DESCRIPTION OF THE DRAWINGS

The aforementioned and other features, characteristics, advantages, and the invention in general, will be better understood from the following, more detailed description taken in conjunction with the accompanying drawings, in which.

Figure 1:
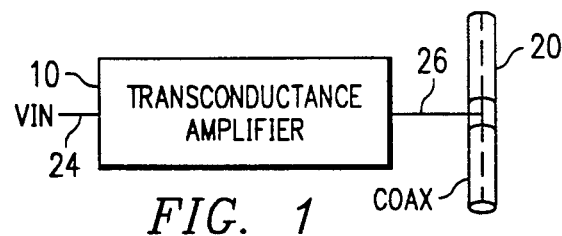
FIG. 1 is a block diagram of an output amplifier of an Ethernet interface circuit having a high speed amplifier according to the present invention.

It will be appreciated that for purposes of clarity and where deemed appropriate, reference numerals have been repeated in the figures to indicate corresponding features.

DETAILED DESCRIPTION

A high speed amplifier according to the preferred embodiment of the present invention includes a first differential amplifier having a positive and a negative input. The negative input is connected to the input signal to the amplifier. The output of the first differential amplifier is connected to the input of a buffer circuit and also to one end of a compensation capacitor. The output of the buffer circuit is connected to the gates of three n-channel transistors, the sources of which are connected together and to a negative supply voltage. The drain of the first transistor is connected to the positive input of the first differential amplifier and to one end of a resistor, the other end of which is connected to ground. The drain of the second MOS transistor is connected to the positive input of a second differential amplifier and also to one end of a second resistor, the other end of which is connected to ground. The drain of the third transistor forms the current output terminal of the amplifier. The second differential amplifier has its negative input connected to the input voltage and its output connected to the other end of the compensation capacitor.

In operation, the input signal is coupled through the first different amplifier. The output from the first differential amplifier is fed through the buffer circuit to the first transistor. The drain of the first transistor is fed back to the positive input of the first differential amplifier so that the current flow through the first resistor is proportional to the input voltage. The current through the first transistor is ratioed up by the common gate connection of the first transistor and the third transistor in order to provide the required output current at the drain of the third transistor. During operation of the amplifier the transconductance of the first transistor varies as the square root of the drain current through the first transistor and this change in transconductance changes the bandwidth of the amplifier. Since the current through the first transistor in the application for which this amplifier was designed changes in a ratio of 16 to 1, the transconductance, gm, and therefore the uncompensated bandwidth, changes on the order of 4 to 1.

In order for the amplifier to remain stable over the full signal range of the amplifier, a compensation capacitor is coupled to the output of the first differential amplifier. The output of the first differential amplifier is a node at which the capacitive loading affects the bandwidth of the amplifier. The other end of the compensation capacitor is coupled to a signal node such that the negative feedback gain of the compensation circuitry to the first node varies proportionally to the gm, or gain, of the first transistor. Since the bandwidth of the amplifier is proportional to the gain of the first transistor divided by the effective compensation capacitance, the Miller multiplied compensation from the compensation circuit causes the bandwidth of the amplifier to be independent of the gm of the first transistor. While the proper compensation could be achieved by connecting the compensating capacitor directly between the output of the first differential amplifier and the drain of the first or second transistor, this arrangement causes distortion. The voltage at the drain of the first or second transistors varies approximately equal to VIN. Therefore in response to a step input, the voltage change across the compensation capacitor causes charging current to flow in the first differential amplifier resulting in distortion from the amplifier's active devices.

With the compensating capacitor connected between the output of the first differential amplifier and the output of the second differential amplifier, however, this distortion is made negligible since the amount of current required to charge the compensating capacitor by the first differential amplifier is negligible when the output of the differential amplifiers are made to track in a manner described below. As a result the slew rate or large signal bandwidth of the amplifier is not degraded by the compensation capacitor as compared to the embodiment where the other end of the compensating capacitor is coupled to the drain of the first or second transistor.

Turning to the drawings, FIG. 1 is a block diagram of an output amplifier of an Ethernet interface circuit which includes a transconductance amplifier 10 and an Ethernet coax cable 20. An input voltage signal VIN appears on line 24 as an input to the transconductance amplifier 10. The transconductance amplifier 10 receives the input voltage waveform on line 24 and provides a proportional current to the coaxial cable at terminal 26. As stated in the BACKGROUND OF THE INVENTION section above, the interface circuit is used to tap into a coax cable. The output current on line 26 must operate into an effective impedance of 25 ohms and must be able to output a current signal which varies approximately between 4.8 milliamps and 77 milliamps.

Figure 2:
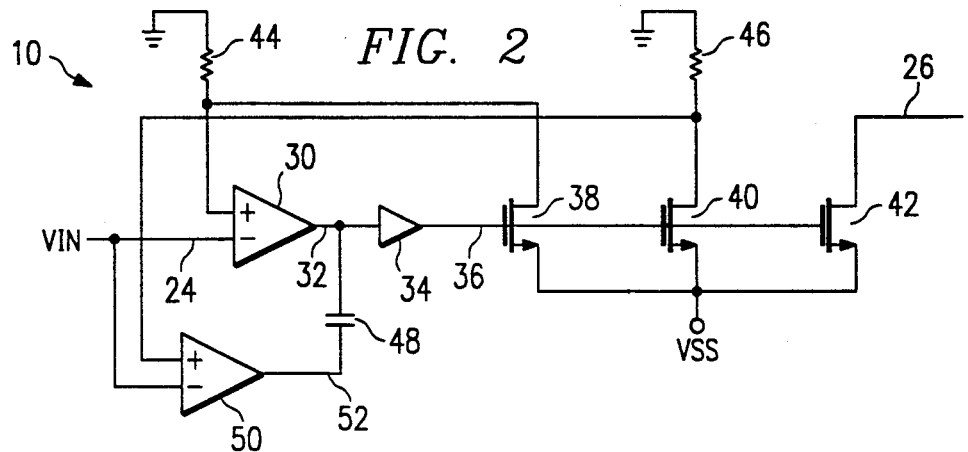
FIG. 2 is a preferred embodiment of a high speed amplifier according to the present invention.

The amplifier 10 shown in FIG. 2 is the preferred embodiment of the present invention. The amplifier 10 receives the input voltage VIN on line 24 at the negative input of a first differential amplifier 30, the output of which is coupled to a compensation node 32 which in turn is coupled to the input of a buffer amplifier 34. The output of the buffer amplifier 34 is connected to a node 36 which is also connected to the gate of a first n-channel transistor 38, to the gate of a second n-channel transistor 40, and to the gate of a third n-channel transistor 42. The sources of the transistors 38, 40, and 42 are connected together and to a first reference potential which is a negative supply voltage of minus 9 volts in the preferred embodiment. The drain of the first transistor 38 is connected to one end of a resistor 44, the other end of which is connected to a second reference potential which is ground in the preferred embodiment. The drain of transistor 38 is also connected to the positive input of the differential amplifier 30. The drain of the transistor 40 is connected to one end of a resistor 46 the other end of which is connected to ground. The minus input of a differential or differencing amplifier 50 is connected to the input signal VIN on line 24, and the positive input of the differential amplifier 50 is connected to the drain of transistor 40. The compensation capacitor 48 is connected between the output of the differential amplifier 50 and node 32. The compensation capacitor 48 comprises a compensation admittance circuit coupled between the output of the differential amplifier 50 and the node 32. Thus the differential amplifier 50, along with the transistor 40 and resistor 46, forms an admittance driver circuit (also referred to as a capacitor driver circuit) in FIG. 2. The drain of the transistor 42 forms the output terminal 26 of the amplifier 10.

In operation if the gm of transistor 40 is proportional to the gm of transistor 38, and the resistance of resistor 46 is similarly proportional to the resistance of resistor 44, then the voltage at the drain of transistor 40 will be forced equal to VIN by the feedback to amplifier 30. The output of differential amplifier 50 will be constant since the voltage level at the positive and negative inputs of differential amplifier 50 will be equal. Therefore the voltage across the compensating capacitor 48 will change much less than the voltage across a compensating capacitor connected directly between node 32 and the drain of transistor 38 or 40 as described above, since these drains vary in an amount equal approximately to the input voltage on line 24. Therefore the current required to be driven by the differential amplifier 30 will be much less in the preferred embodiment resulting in a corresponding decrease in distortion in the differential amplifier 30. The compensation will be the same as long as the overall gain of the compensating capacitor driving circuit remains the same. I.e., the compensation will be the same as long as $gm_{40}$ times $R_{46}$ times $C_{48}$, when the compensation capacitor 48 is connected between node 32 and the drain of transistor 40, is equal to $gm_{40}$ times $R_{46}$ times $C_{48}$ times $G_{50}$, when the compensation capacitor 48 is connected as shown in FIG. 2., where $G_{50}$ is the gain of amplifier 50.

However, another improvement can be made by adjusting the gm of transistor 40, the resistance of resistor 46, and the gain of the differential amplifier 50 in order to make the output of the differential amplifier 50 at node 52 track the voltage at the node 32 while maintaining the same overall combined gain.

Assuming that the gain of the buffer 34 is $\approx 1$, and that the gain of differential amplifier 30 is $>>1$, then $$V_{52} = (V_{32}(-gm_{40} \cdot R_{46}) - V_{in})G_{50}$$

$$V_{in} = -gm_{38} \cdot R_{44} \cdot V_{32}$$

$$V_{52} = (V_{32}(-gm_{40} \cdot R_{46} + gm_{38} \cdot R_{44}))G_{50}$$

$$V_{52} = V_{32}$$

$$(-gm_{40} \cdot R_{46} + gm_{38} \cdot R_{44})G_{50} = 1$$

$$\text{or } G_{50} = \frac{1}{gm_{38} \cdot R_{44} - gm_{40} \cdot R_{46}}$$

Therefore if the gain of the differential amplifier 50 is set to the inverse of the difference between the gm of transistor 38 times the resistance of resistor 44 and the gm of transistor 40 times the resistance of resistor 48 then the voltage at node 52 will track the voltage at node 32.

In practice however there are additional parasitic capacitances on node 32, and if the gain $G_{50}$ of differential amplifier 50 is slightly higher than calculated, the differential amplifier 50 will provide current for these stray capacitances through the compensation capacitor 48.

It will be appreciated that the buffer circuit 34 is used to isolate the capacitance on node 32 from the gate-to-source capacitances of transistors 38, 40, and 42. In certain applications in which these additional gate-to-source capacitances are not critical, the buffer 34 may be eliminated.

Figure 3A:
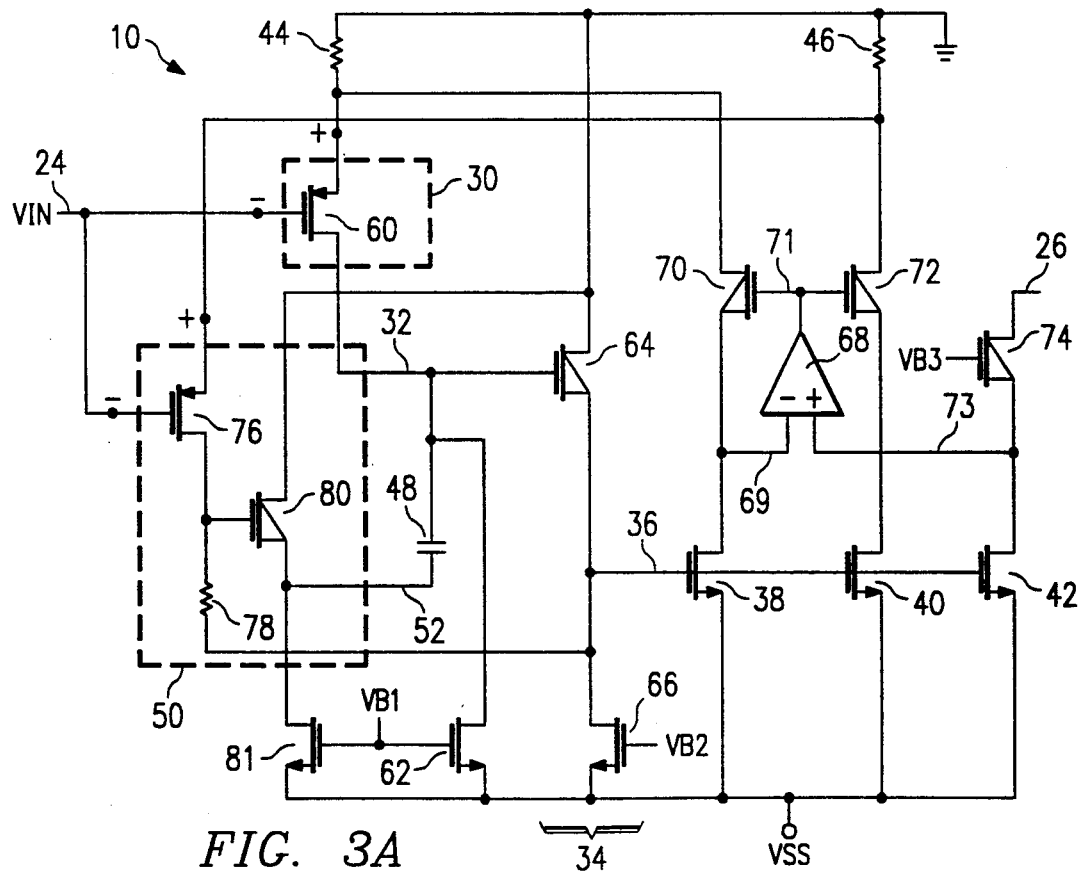
FIGS. 3A and 3B are a more detailed schematic of the preferred embodiment of a transconductance amplifier according to the present invention.
Figure 3B:
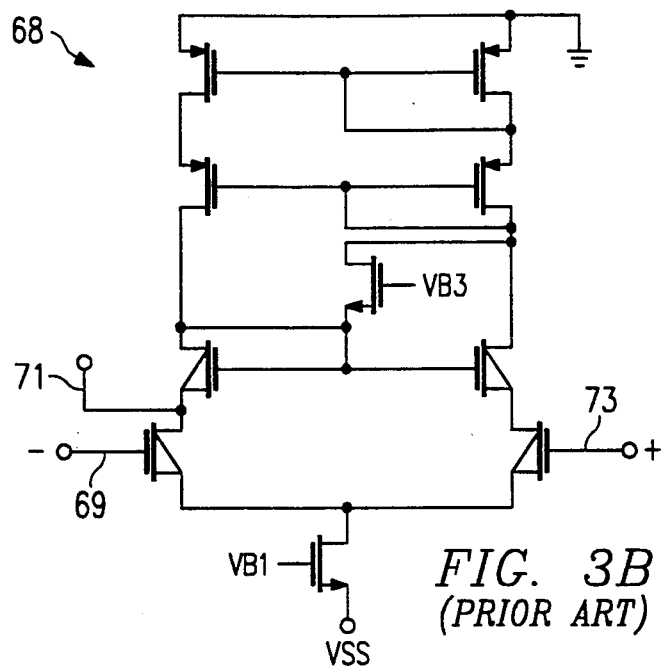

Turning now to FIGS. 3A and 3B, a more detailed schematic diagram of the preferred embodiment of FIG. 2 is shown. The amplifier 10 of FIG. 3A receives the input signal VIN on line 24 to a differential amplifier 30 which comprises a p-channel transistor 60 in which the source of the transistor forms the positive input of the differential amplifier 30 and the gate forms the negative input. The output of the differential amplifier 30 is the drain of the p-channel transistor 60 which is connected to one terminal of capacitor 48 and to the input of the buffer 34 and to the drain of an n-channel transistor 62, the source of which is connected to VSS, and the gate of which is connected to a reference voltage VB1. The buffer circuit 34 consists of two transistors 64 and 66. A first native transistor 64 has its gate connected to node 32, and its drain connected to ground. The source of transistor 64 is connected to node 36 and to the drain of an n-channel transistor 66 the source of which is connected to VSS, and the gate of which is connected to the second bias voltage VB2. Node 36 is connected to the gates of the n-channel transistors 38, 40, and 42 whose sources are connected to VSS.

The drain of transistor 38 is connected to the negative input of a differential amplifier 68 on a line 69 and to the source of native transistor 70. The drain of transistor 70 is connected to the node formed by one end of resistor 44 and the positive input of the differential amplifier 30. The other end of resistor 44 is connected to ground. The gate of transistor 70 is connected to a node 71 which is connected to the output of the differential amplifier 68 and to the gate of another native transistor 72. The drain of the transistor 40 is connected to the source of the transistor 72, the drain of which is connected to a node formed by resistor 46 and the positive input of a differential amplifier 50. The other end of resistor 46 is connected to ground. The drain of the transistor 42 is connected to the positive input of the differential amplifier 68 on a line 73 and also to the source of another native transistor 74 the drain of which forms the output terminal 26 of the amplifier 10. The gate of the transistor 74 is connected to a third bias voltage VB3.

The differential amplifier 50 has a p-channel input transistor 76 in which the source of transistor 76 forms the positive input of the differential amplifier 50 and the gate of the transistor 76 forms the negative input. The drain of the transistor 76 is connected to a resistor 78 and to the gate of a native transistor 80. The other end of the resistor 78 is connected to the node 36. The drain of the transistor 80 is connected to ground. The output of the differential amplifier 50 is the source of the transistor 80 which is connected to the drain of an n-channel transistor 81, the source of which is connected to VSS, and the gate of which is connected to VB1. This output drives one terminal of the capacitor 48, the other terminal of which is connected to the node 32. Although the bias generating circuitry is not shown in the drawings in order to avoid undue clutter, it will be understood that the bias voltage VB1, VB2, and VB3 can be generated by any of several means well known to those skilled in the art. In the preferred embodiment the circuitry shown in FIGS. 3A and 3B are formed on a single CMOS integrated circuit.

As shown in FIG. 3A the differential operation of the differential amplifiers 30 and 50 is performed by the source and gate terminals of transistors 60 and 76 respectively. Moreover the inverting gain of the differential amplifier 50 is affected by the ratio of the resistors 46 and 78, and the compensation feedback gain is primarily affected by the gm of the transistor 40 and the resistance of resistor 78.

Advantageously, the output reference node of differential amplifier 50 (the end of resistor 78 not connected to transistors 76 and 80) is connected to node 36. Thus as the voltage on node 36 changes, the output of the differential amplifier 50 (at node 52) also changes in a like manner. This connection helps to keep the voltage constant across the compensation capacitor 48 which reduces distortion.

It is also shown in FIG. 3A that the transistors 70, 72, and 74 are placed in a cascode arrangement. Since the output terminal 26 is DC connected to the inner conductor of a coax cable to which other driver circuits are also connected, the transistor 74 is used to help isolate transistor 42 and differential amplifier 68 from voltage changes which occur on the coax cable. Transistor 70 and 72 are used to match the cascode arrangement of transistor 74. The differential amplifier 68 operates to improve the matching between the output current path and the feedback current path, and to improve the output impedance characteristics of the amplifier 10. Since the gain of transistor 74 is finite and its output impedance is not a perfect current sink, amplifier 68 operates to compare the drain voltage of transistors 38 and 42 and to adjust the feedback paths containing transistors 38 and 40 in order to compensate for the variations in the drain voltage of transistor 42 during normal operation.

FIG. 3B is a schematic diagram of the differential amplifier 68. The differential amplifier shown in FIG. 3B is considered to be of standard design, and is included for completeness of the drawings.

Figure 4:
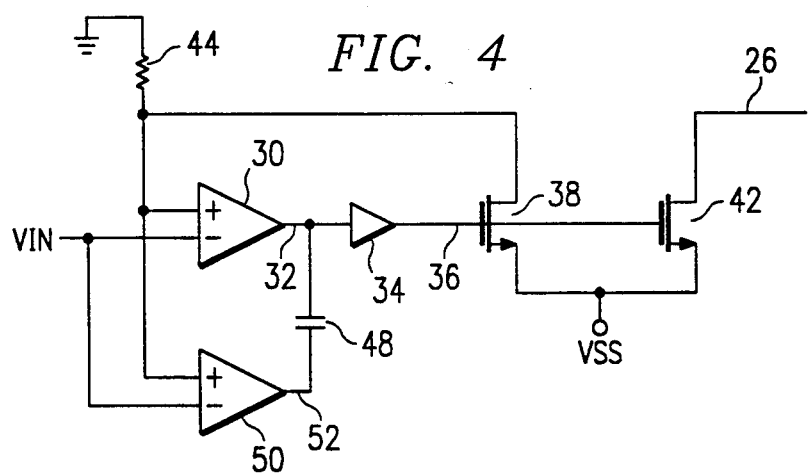
FIG. 4 is a circuit diagram of an alternative embodiment of FIG. 2.

FIG. 4 is a schematic diagram of an alternative embodiment of the present invention in which the transistor 40 and the resistor 46 of FIG. 2 have been eliminated, with the positive input of the differential amplifier 50 connected to the drain of transistor 38. Thus the drain of transistor 38 is used for the positive inputs of differential amplifiers 30 and 50. This embodiment limits the flexibility of having node 52 track node 32 to eliminate any charging on capacitor 48. However it is still much better than charging the capacitance that would by present if capacitor 48 was connected from node 32 to the positive input of the differential amplifier 30 as discussed above.

While this embodiment reduces the number of components shown in FIG. 4 as compared to FIG. 2, the differential amplifiers 30 and 50 in FIG. 4 would have to have high impedance inputs at their positive terminals, or the sizes of the transistor 38 and the resistor 44 would have to be modified to be approximately equal to the parallel combination of transistors 38 and 40 and resistors 44 and 46 respectively. This would save little circuit area while increasing the offset and gain error sensitivity of the amplifier.

Figure 5:
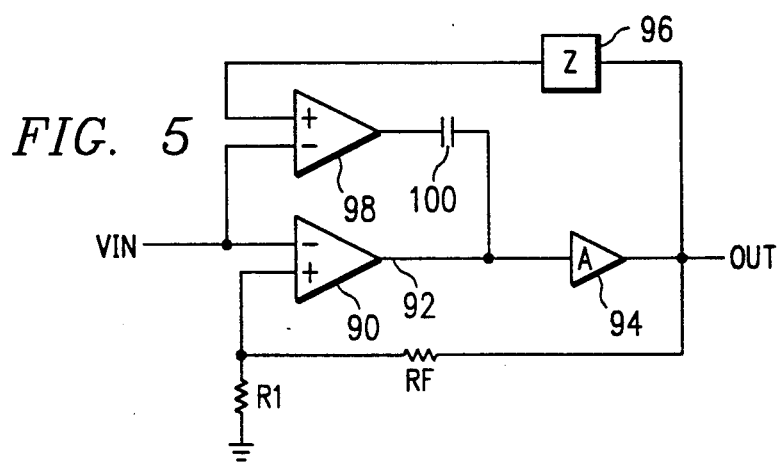
FIG. 5 is a circuit diagram of an equivalent circuit of FIG. 2.

FIG. 5 is a circuit diagram of an equivalent circuit to that shown in FIG. 2 and shows a more general application of the present invention. In FIG. 5 an input voltage VIN is connected to the negative input of a differential amplifier 90, the output of which is connected to a node 92, which in turn is connected to the input of an amplifier 94. The output of the amplifier 94 is fed back to the differential amplifier 90 through a feedback resistor RF to the positive input on the differential amplifier 90. The positive input is also coupled to ground through a resistor R1. Normally the compensation capacitor is connected as a feedback across the input and output of the inverting amplifier 94. But in the present invention, in order to avoid distortion caused by the compensating capacitor, the output of the amplifier 94 is coupled through an attenuator 96 to the positive input of a controlled gain differential or differencing amplifier 98. The output of the amplifier 98 is connected to one end of a compensating capacitor 100, the other end of which is connected to the compensation node 92. The negative input of the differential amplifier 98 is connected to VIN.

For the noninverting amplifier shown in FIG. 5 the relative gains of the signals coming into the differential amplifier 98 must be scaled so that there is no output from the differential amplifier 98 or, such that node 98 tracks node 92, while the overall amplifier is in the linear range of operation. In other words the gain of the attenuator 96 should be approximately equal to RF/(RF+R1). Also the gain of the differential amplifier 98 must be set so that the product of the gain of the amplifier 94 times the gain of the attenuator 96 times the gain of the differential amplifier 98 times the value of the compensation capacitor 100 gives the desired equivalent value of capacitance at the output of the differential amplifier 90. In this configuration as the gain of the amplifier 94 varies so does the equivalent value of capacitance at node 92, so the amplifier bandwidth is insensitive to the gain of the amplifier 94. The design of the circuit elements shown in FIG. 5 is well within the skills of those practicing in the art.

Figure 6:
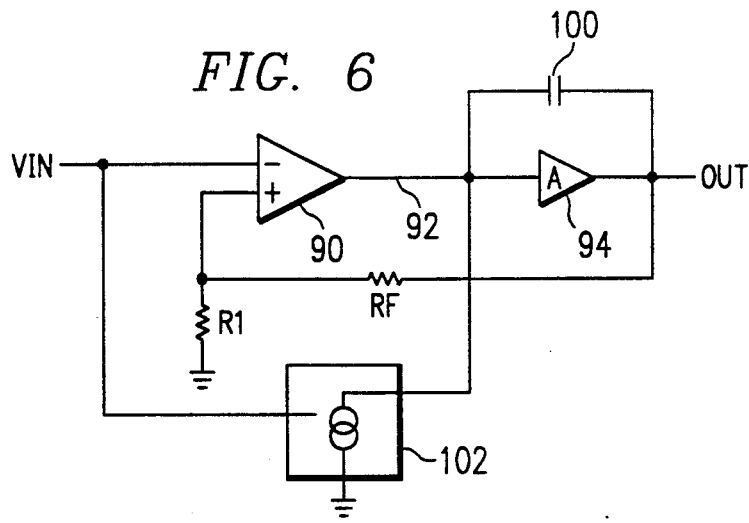
FIG. 6 is a circuit diagram of alternative embodiment of a high speed amplifier according to the present invention.

FIG. 6 is a circuit diagram of the general case of an alternative embodiment of a high speed amplifier according to the present invention As shown in FIG. 6 the compensation capacitor 100 is coupled between the input and output of the inverting amplifier 94 and the differential amplifier 98 and the attenuator 96 of FIG. 5 are replaced by a transconductance amplifier or current injection circuit 102. The input to amplifier 102 is coupled to VIN and the output is connected to node 92. In this circuit the major portion of the current used to charge the compensation capacitor 100 is provided by the transconductance current source 102. The voltage change across the compensation capacitor 100 in response to an input signal VIN is:

$$V_{100} = VIN \cdot \left(1 + \frac{RF}{R1}\right) \cdot \left(1 - \frac{1}{G_{94}}\right)$$

where
$V_{100}$ = the voltage change across capacitor 100
VIN = the voltage change at VIN
$G_{94}$ = the gain of amplifier 94.

So, the current required to change the voltage on the compensation capacitor 100 in response to VIN is:

$$I_{100} = C_{100} \cdot \frac{d(V_{100})}{dt}$$

where $I_{100}$ is the charging current for the compensation capacitor 100 and $C_{100}$ is the capacitance of the compensation capacitor 100. Substituting for $V_{100}$:

$$I_{100} = C_{100} \cdot \left(1 + \frac{RF}{R1}\right) \cdot \left(\frac{d\left[VIN \cdot \left(1 - \frac{1}{G_{94}}\right)\right]}{dt}\right)$$

Assuming that the magnitude of the gain of amplifier 94 is >>1, then the current $I_{100}$ can be approximated by $$I_{100} = C_{100} \cdot \left(1 + \frac{RF}{R1}\right) \cdot \frac{dVIN}{dt} \quad \text{or}$$

$$I_{100} = k \cdot \frac{dVIN}{dt}$$

where k is a constant given by the product of $C_{100}$ and the closed loop gain of the amplifier, 1+(RF/R1). Therefore the current supplied by the current source 102 is proportional to the time derivative of the input voltage VIN, and is scaled to provide the charging current required by capacitor 100 when the amplifier 10 is in the linear range of operation.

Figure 7:
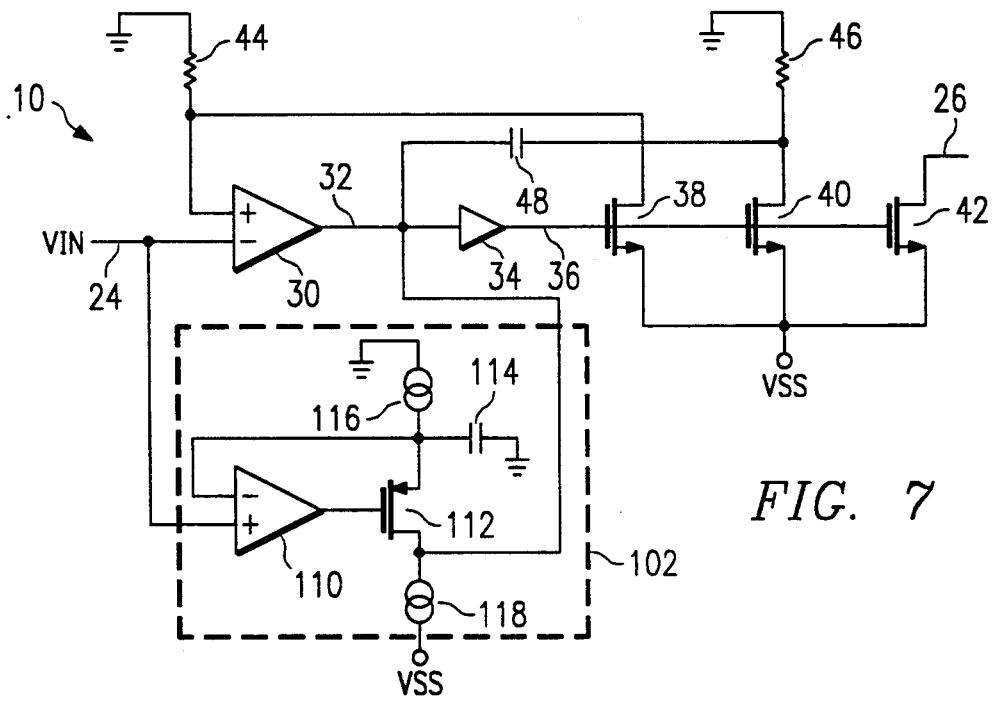
FIG. 7 is a circuit diagram of the alternative embodiment of FIG. 6.

FIG. 7 is the application of the alternative embodiment of FIG. 6. The amplifier of FIG. 7 uses the circuitry shown in FIG. 2 but with the differential amplifier 50 replaced with the current injection circuit 102, and the capacitor 48 coupled between the node 32 and the drain of the transistor 40. The input of the current injection circuit 102 is coupled to VIN and the output of the current injection circuit 102 is coupled to the compensation node 32. The current injection circuit 102 comprises a third differential amplifier 110 having its positive input connected to the input voltage VIN on line 24 and its output connected to the gate of a p-channel transistor 112. The source of the transistor 112 is connected to the negative input of the differential amplifier 110 and also to one end of a capacitor 114, the other end of which is connected to ground. Also connected to the source of transistor 112 is a current source 116 the other side of which is connected to ground. The drain of transistor 112 is connected to a second current source 118 the other side of which is connected to the minus supply voltage. It will be understood that the current sources 116 and 118 are essentially equal to each other so as not to disturb the DC operating point of the differential amplifier 30. The drain of the transistor 112 is also connected to node 32.

The current injection circuit of FIG. 7 operates by providing a current source to node 32 to supply the current to the compensating capacitor 48 and thereby effectively avoid the distortion in the differential amplifier 30. If the gain of the transistor 40 is high enough, then the current required by the compensating capacitor 48 is dominated by the change in voltage at the drain of transistor 40 which is proportional to the voltage across resistor 44 and therefore proportional to the input voltage VIN on line 26. By setting the product of the change in VIN and the capacitance of the capacitor 114 equal to the product of the change in the voltage at the drain of transistor 40 and the capacitance of the compensating capacitor 48, the charging current required by the compensating capacitor is supplied by the charge injection circuit containing transistor 112, capacitor 114, and amplifier 110 instead of the differential amplifier 30. The magnitude of the current supplied by the current injection circuit 102 can also be slightly modified from the above equality to compensate for the voltage change which occurs on node 32 with varying input voltage VIN and to compensate for any additional stray capacitance at node 32.

Figure 8:
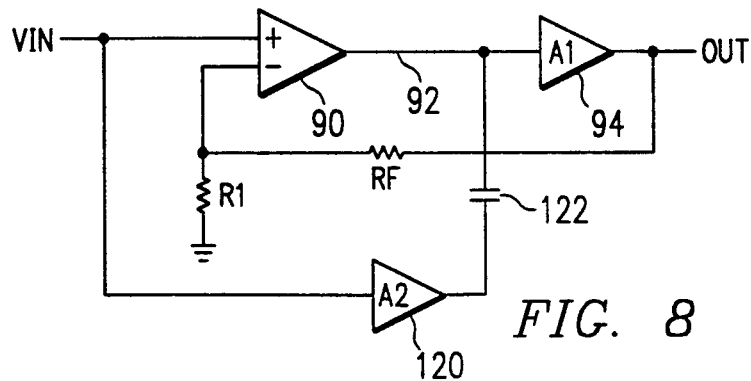
FIG. 8 is a circuit diagram of another embodiment of a high speed amplifier according to the present invention.

FIG. 8 is a circuit diagram of a general case of another embodiment of a high speed amplifier with enhanced slew rate according to the present invention. In FIG. 8 a controlled gain amplifier, or buffer, 120 has its input connected to VIN and its output connected to one end of the compensating capacitor 122, the other end of which is connected to the node 92 which is the compensation node of the amplifier. In this circuit the gain of the amplifier 120 is approximately equal to the overall gain of the amplifier 1+(RF/R1) divided by the gain of the amplifier or buffer stage 94. This forces the signal voltage across the compensation capacitor 122 to zero eliminating the compensation capacitor charging current normally supplied by the input differential amplifier 90, and thereby improving distortion.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example each embodiment shows an inverting or a noninverting amplifier. Each of these embodiments can be used in an amplifier of the opposite polarity (inverting or noninverting) with appropriate polarity changes in the feedback signals as will be evident to those skilled in the art.

What is claimed is:

1. In an integrated circuit feedback amplifier having an internal compensation node which is driven by an active circuit, and said compensation node being located by a compensation admittance for frequency compensation wherein a first terminal of said compensation admittance is coupled to said compensation node, said amplifier also having a compensation driving amplifier having a first input coupled to an input signal to said amplifier and a second input coupled to a second node in said amplifier having signal characteristics which vary in an amount approximately proportional to device parameters being compensated for to thereby reduce the charging requirements of said compensation admittance circuit by said active circuit during normal operation of said amplifier.

2. The amplifier set forth in claim 1 where said compensation driving amplifier is a buffer.

3. The amplifier set forth in claim 1 where said compensation admittance circuit is a compensation capacitor.

4. In a feedback amplifier, the bandwidth of which is determined in part by device parameters of active devices in said amplifier which may vary during operation of said amplifier, a frequency compensation circuit for driving a compensation admittance coupled to a compensation node, wherein the admittance at said compensation node affects the bandwidth of said amplifier, said frequency compensation circuit comprising:

a differencing amplifier having an output coupled to one end of said compensation admittance, the other end of said compensation admittance being coupled to said compensation node, a first input of said differencing amplifier being coupled to an input signal to said amplifier, and a second input of said differencing amplifier being coupled to a second node in said amplifier having signal characteristics which vary in an amount approximately proportional to the device parameters being compensated for by said frequency compensation circuitry wherein the positive and negative gain of said differencing amplifier are scaled to reduce the signal charging current needed by said compensation admittance circuit during operation.

5. The amplifier set forth in claim 4 wherein said device parameter is the change in gm of an active device in said amplifier.

6. The amplifier set forth in claim 5 wherein said active device is an MOS transistor.

7. The amplifier set forth in claim 4 wherein the compensation admittance is a capacitor.

8. An MOS current driver circuit comprising:
a) a first differential amplifier having a first input for receiving an input signal;
b) a feedback transistor having its gate coupled to an output of said differential amplifier, its source coupled to a first reference potential, and its drain coupled to a second input of said first differential amplifier and to one end of a first resistive element, the other end of which is coupled to a second reference potential, said first differential amplifier, said feedback transistor and said resistive element being operable to cause the signal level at said second input of said first differential amplifier to change in the same direction as a change at said first input of said first differential amplifier;
c) an output transistor for providing an output current at the drain of said output transistor, the gate of said output transistor coupled to the gate of said first feedback transistor;
d) a compensation transistor having its gate coupled to said output of said differential amplifier, its source coupled to said first reference potential, and its drain coupled to one end of a second resistive element, the other end of which is coupled to said second reference potential; and
e) a second differential amplifier having a first input for receiving said input signal and a second input coupled to said drain of said compensation transistor, and an output coupled to one end of a capacitor, the other end of said capacitor being coupled to said output of said first differential amplifier to compensate said first amplifier.

9. An MOS current driver circuit as set forth in claim 8 further including a buffer circuit interposed between a first node and a second node, said first node formed by the connection of said capacitor and the output of said differential amplifier, and said second node formed by the common connection of the gates of said feedback transistor and said compensation transistor, the input of said buffer circuit coupled to said first node and the output of said buffer circuit coupled to said second node.

10. In a feedback amplifier having a compensation node which is driven by an active circuit, and said node being loaded by a compensation admittance circuit, a current injection circuit being coupled to an input signal to said amplifier and to said node for injecting or sinking current from said node in response to any change in said input signal to help charge or discharge said compensation admittance circuit.

11. An amplifier as set forth in claim 10 wherein said compensation admittance circuit is a capacitor.

12. An amplifier as set forth in claim 10 wherein said current injected or sunk from said node is proportional to the time derivative of said input signal.

13. An MOS current driver circuit comprising:
a) a first differential amplifier having a first input for receiving an input signal;
b) a feedback transistor having its gate coupled to an output of said differential amplifier, its source coupled to a first reference potential, and its drain coupled to a second input of said first differential amplifier and to one end of a first resistive element, the other end of which is coupled to a second reference potential, said first differential amplifier, said feedback transistor and said resistive element being operable to cause the signal level at said second input of said first differential amplifier to change in the same direction as a change at said first input of said first differential amplifier;
c) an output transistor for providing an output current at the drain of said output transistor, the gate of said output transistor coupled to the gate of said first feedback transistor;
d) a compensation transistor having its gate coupled to said output of said differential amplifier, its source coupled to said first reference potential, and its drain coupled to one end of a second resistive element, the other end of which is coupled to said second reference potential, its drain also coupled to one end of a first capacitor, the other end of said first capacitor coupled to said output of said first differential amplifier;
e) a second differential amplifier having a positive input coupled to said input signal, and an output coupled to the gate of a first transistor, the source of the first transistor coupled to the minus input of said second differential amplifier;
f) a first current source coupled between the source of said first transistor and said second reference potential;
g) a second current source equal value to said first current source and coupled between said first reference potential and the drain of said first transistor;
h) a second capacitor coupled between the source of said first transistor and a second reference potential; and
i) the drain of said first transistor coupled to the output of said first differential amplifier.

14. An MOS current driver circuit as set forth in claim 13 further including a buffer circuit interposed between a first node and a second node, said first node formed by the connection of said first capacitor and the output of said differential amplifier, and said second node formed by the common connection of the gates of said feedback transistor and said compensation transistor, the input of said buffer circuit coupled to said first node and the output of said buffer circuit coupled to said second node.

15. A method for reducing the charging requirements of a compensation admittance circuit by an active circuit in an integrated circuit feedback amplifier, said amplifier having an internal compensation node which is driven by said active circuit, said compensation node being loaded by said compensation admittance circuit for frequency compensation wherein a first terminal of said compensation admittance is coupled to said compensation node, said amplifier also having a compensation driving amplifier for controlling the voltage at a second terminal of said compensation admittance, said method for reducing the charging requirements comprising the steps of:
  a) generating an input derived signal which is derived from the signal at said input terminal;
  b) applying said input derived signal to a first input of said compensation driving amplifier;
  c) generating a compensation signal which varies linearly with the output signal of the amplifier; and
  d) applying said compensation signal to a second input of said compensation driving amplifier.

16. A method for reducing the charging requirement of a compensation admittance circuit by an active circuit in an integrated circuit feedback amplifier, said amplifier having an internal compensation node which is driven by said active circuit, said compensation node being loaded by a compensation admittance circuit for frequency compensation, said method for reducing the charging requirement of said compensation admittance comprising the steps of:
  a) generating an injection current derived from the signal at an input terminal of said amplifier, said injection current being proportional to the time derivative of said signal at said input terminal;
  b) applying said injection current to said compensation node.

* * * * *